United States Patent

Kurihara

[11] Patent Number: 5,882,825
[45] Date of Patent: Mar. 16, 1999

[54] PRODUCTION METHOD OF A PHASE SHIFT PHOTOMASK HAVING A PHASE SHIFT LAYER COMPRISING SOG

[75] Inventor: Masaaki Kurihara, Tokyo, Japan

[73] Assignee: DAI Nippon Printing Co., Ltd., Tokyo, Japan

[21] Appl. No.: 695,024

[22] Filed: Aug. 9, 1996

[30] Foreign Application Priority Data

Aug. 9, 1995 [JP] Japan .................................. 7-222757

[51] Int. Cl.⁶ ........................................................ G03F 9/00
[52] U.S. Cl. ............................................................... 430/5
[58] Field of Search ................................ 430/5, 322, 323, 430/324

[56] References Cited

U.S. PATENT DOCUMENTS 5,556,724  9/1996  Tarumoto et al. ............................ 430/5

*Primary Examiner*—S. Rosasco

*Attorney, Agent, or Firm*—Sughrue, Mion, Zinn, Macpeak & Seas, PLLC

[57] ABSTRACT

The present invention is directed to a method of producing a phase shift photomask having a shifter pattern comprising SOG having a transmittance high-enough to be usable with ultraviolet radaition such as KrF (of 248 nm wavelength) used for transfer onto wafers by forming an acid generator-containing SOG directly into plate to form an SOG shifter pattern. This production method at least comprises steps of coating an acid generator-containing SOG on a photomask substrate, selectively irradiating the thus coated SOG layer with ionizing radiation, and developing the SOG layer with a suitable solvent to form a shifter pattern comprising said SOG, and further includes a step of irradiating the overall surface of the thus formed SOG shifter pattern with ultraviolet radiation and/or heating the thus formed SOG shifter pattern at a high temperature to decompose a photosensitive group absorbing ultraviolet radiation, thereby making the SOG layer transparent to ultraviolet radiation used to transfer said SOG layer onto a wafer.

8 Claims, 7 Drawing Sheets

FIG. 1 (a) Blank substrate
FIG. 1 (b) Coating and drying of SOG, and coating of antistatic film
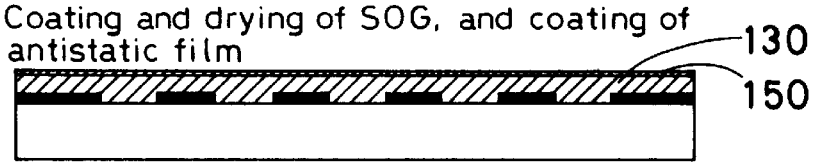
FIG. 1 (c) EB Exposure
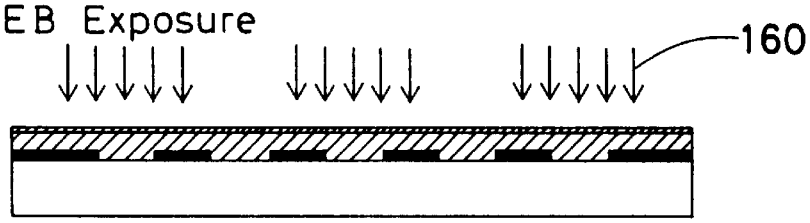
FIG. 1 (d) PEB
FIG. 1 (e) Development
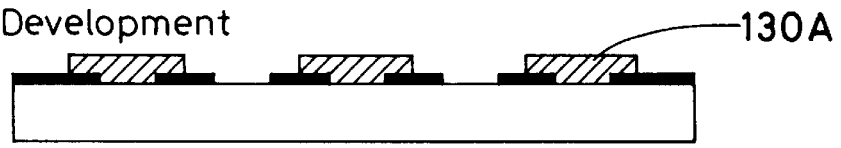
FIG. 1 (f) Irradiation with ultraviolet
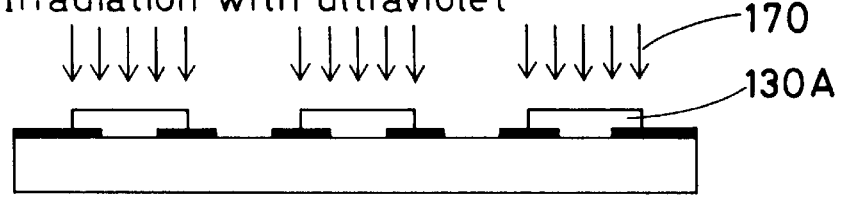
FIG. 1 (g) Firing

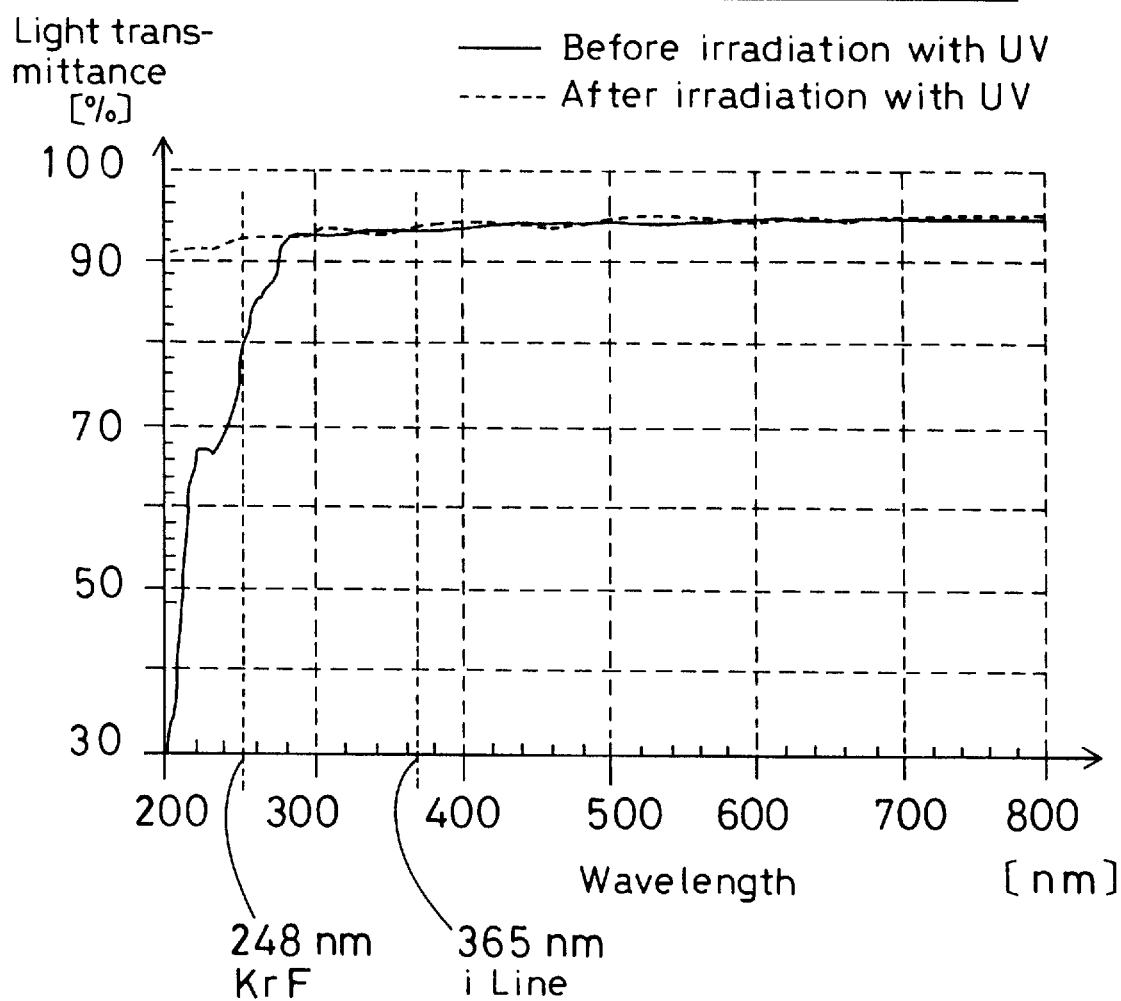

FIG. 3 (a) Blank substrate
FIG. 3 (b) Coating and drying of SOG
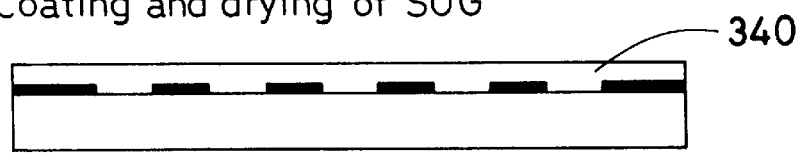
FIG. 3 (c) EB Exposure
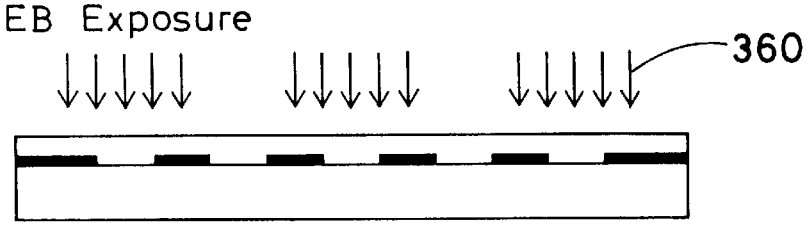
FIG. 3 (d) Development
FIG. 3 (e) Firing
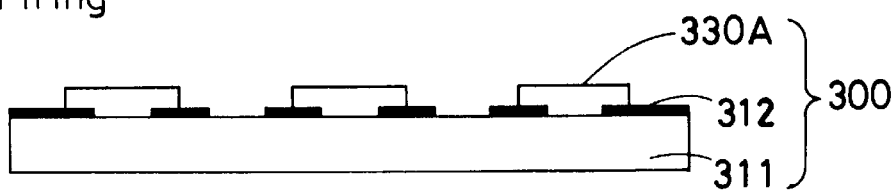

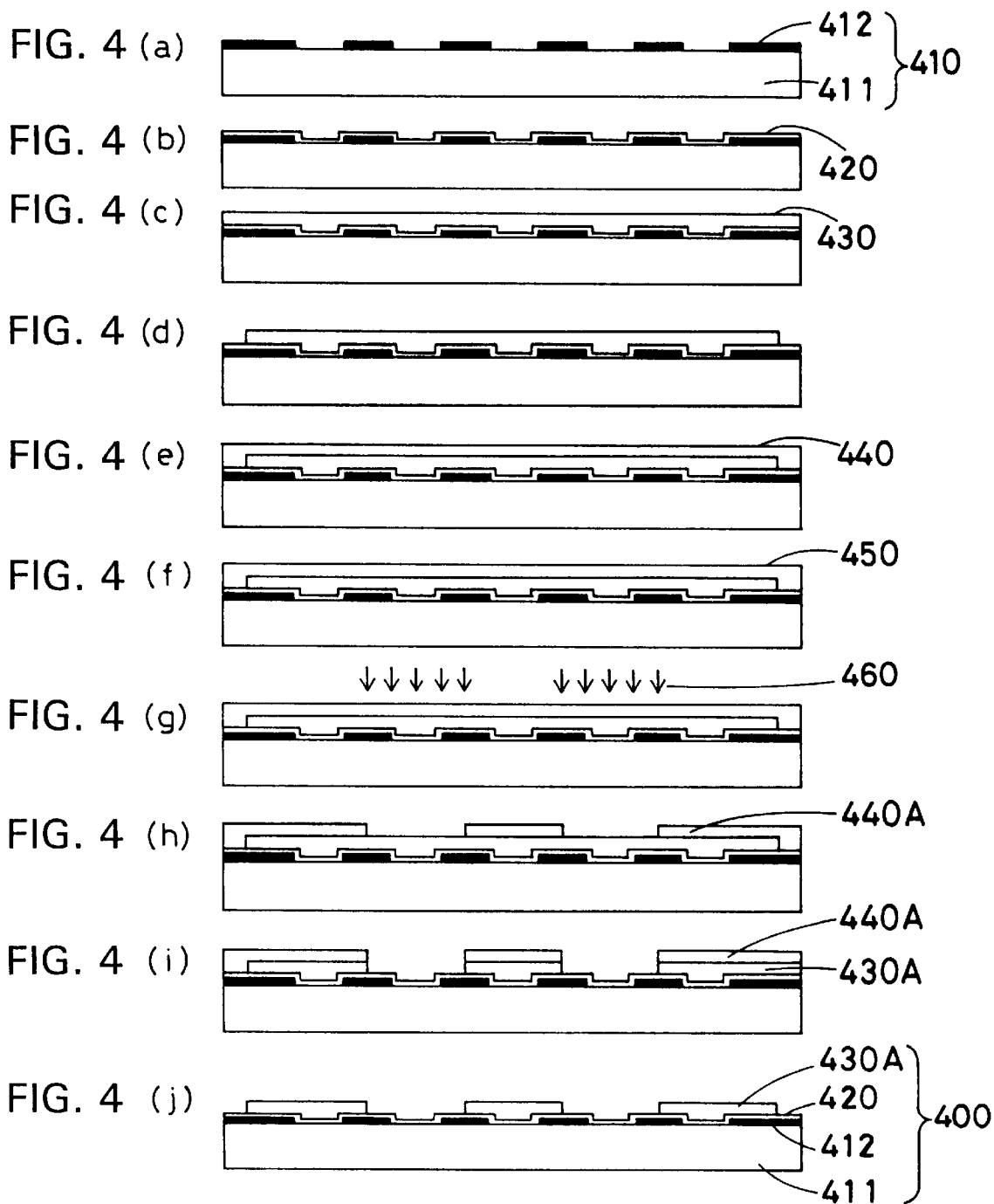

PRODUCTION METHOD OF A PHASE SHIFT PHOTOMASK HAVING A PHASE SHIFT LAYER COMPRISING SOG

BACKGROUND OF THE INVENTION

The present invention relates generally to a production method of a phase shift photomask used to form fine patterns at high density, which are used for the production of high-density integrated circuits such as very LSIs and ultra-very LSIs, and more particularly to a production method of a phase shift photomask having a phase shift layer comprising spin-on glass (SOG for short).

As the degree of integration of semiconductor integrated circuits becomes higher, reticles used for circuit fabrication are now required to become finer and finer. At present, line widths of device patterns transferred from five-fold reticles for DRAMs of 16 megabytes are as fine as 0.6 $\mu$m. Device patterns for DRAMS of 64 megabytes are now required to have a resolution of 0.35 $\mu$m line width, and so can no longer be achieved by conventional light exposure systems using steppers.

To achieve this by forming fine patterns, methods of forming such fine patterns by making wavelengths of exposure light sources short, making transfer lenses have a high NA, and using zonal illumination, or methods of forming patterns by direct electron beam lithography without recourse to any photomask are now under investigation. A grave problem with such pattern-forming methods are, however, that some added cost is needed because of renovation of existing exposure systems, and introduction of new equipment.

For this reason, attention is now directed to pattern transfer methods using a phase shift photomask, which enable currently available steppers to be used for the formation of fine patterns.

Basic concepts and principles of a phase shift photomask have already been disclosed in JP-A-58-17344 and JP-B-62-59296. A particular merit of the phase shift photomask, which makes it possible to use existing exposure systems without giving any modification thereto, is now taken into reconsideration, and so various types of phase shift photomasks are under active development.

A brief account will now be given of the principles of transfer using a phase shift photomask with reference to FIG. 5. For the purpose of comparison, a transfer method using a conventional photomask will be explained with reference to FIG. 6, thereby explaining a resolution difference between both methods.

FIG. 5(a) is a diagram illustrating how to use a phase shift photomask 500 to conduct projection alignment using exposure light 550, and FIGS. 5(b) and 5(c) show a light amplitude profile and a light intensity profile, respectively, as measured on a resist-on-wafer. FIG. 6(a) is a diagram illustrating how to use a conventional photomask 600 to conduct projection alignment using exposure light 650, and FIGS. 6(b) and 6(c) show a light amplitude profile and a light intensity profile, respectively, as measured on a resist-on-wafer.

In FIGS. 5(a) and 6(a), reference numerals 510 and 610 stand for a transparent substrate, 520 an etching stopper layer, 530 and 630 a block (chromium) film, 540 a shifter, 550 and 650 exposure light (ionizing radiation), 500 a phase shift photomask, and 600 a conventional photomask.

The phase shift photomask 500 shown in FIG. 5(a) is made up of the transparent substrate 510, a line-and-space pattern formed of the block films 530 at a given width and pitch and located on the transparent substrate 510, openings provided at every one such line-and-space pattern, and shifter layers 540, each located astride the block layers 530 adjoining one opening, and the conventional photomask 600 shown in FIG. 6(a) is built up of the transparent substrate 610, and a line-and-space pattern composed of the block films 630 at a given width and pitch and located on the transparent substrate 610. It is here to be noted that the etching stopper layer 520 is provided all over the surface of the transparent substrate 510 between the substrate 510 and each block layer 530.

As the exposure light 550 is incident on the phase shift photomask 500, the amplitude of the light transmitting through the shifter portion 540 is shifted from the amplitude of the light transmitting between the shifter-free block films 530 by a phase n $\pi$ (n is an odd number), and inverted on the emerging side. For this reason, these lights interfere with each other on the resist-on-wafer to have such an amplitude profile as shown in FIG. 5(b) and, hence, such a light intensity profile as shown in FIG. 5(c).

In the case of the arrangement using the conventional photomask 600, however, the amplitude of the light emerging from the photomask has such a profile on the resist-on-wafer as shown in FIG. 6(b), because the light emerging from the openings is in phase and so interferes with each other. Consequently, the emerging light has such an intensity profile on the resist-on-wafer as shown in FIG. 6(c).

In the light intensity profile shown in FIG. 5(c) there are points between knolls, at which the intensity of the light becomes zero, while in the profile shown in FIG. 6(c) the profile form of light intensity spreads out. In other words, the light intensity profile shown in FIG. 5(c) is superior to that shown in FIG. 6(c) in terms of resolution on the resist-on-wafer.

Thus, the transfer method using the phase shift photomask 500 is found to be superior to that using the conventional photomask 600 in terms of resolution, so that the former can achieve transfer of finer patterns than would be possible with the latter.

The phase shift photomask shown in FIG. 5 is referred to as a Levenson type of phase shift photomask. Many other phase shift photomasks varying largely in structure are available, for instance, halftone and auxiliary types, and they work on the same basic concepts and principles and so may be used depending on what purpose they are used for. The Levenson type in particular is alleged to be effective to improve the resolution of a line-and-space or other pattern.

For the Levenson type of phase shift photomask shown in FIG. 5, SOG (spin-on glass) that is a coated type of silicon oxide is commonly used.

The SOG has been used not only for the aforesaid Levenson type of phase shift photomask but also for an edge block type of phase shift photomask such as one shown in FIG. 7(c) and a rim type of phase shift photomask such as one shown in FIG. 7(d).

It is here to be noted that the phase shift photomask shown in FIG. 5 is of the same type as shown in FIG. 7(a), wherein a shifter layer is laid over a block layer of a Levenson type of phase shift photomask, and so is called a shifter overlaid type of Levenson phase shift photomask. What is shown in FIG. 7(b) is, on the other hand, called a shifter underlay type of Levenson phase shift photomask wherein, as illustrated, a shifter layer 730B is situated under a block layer 740B.

The thicknesses of the shifter layers 730A, 730B, 730C and 730D, each composed of SOG, are controlled such that the phase of exposure light used for transfer is shifted by n π (n is an odd number) and inverted when it passes at its wavelength through them.

It is to be understood that in FIGS. 7(a) to 7(d) transparent substrates are represented by 710A, 710B, 710C and 710D, etching stopper layers by 720A, 720B, 720C and 720D, and block (chromium) films by 740A and 740D.

As mentioned above, the SOG has commonly been used for shifter layers, and patterned as mentioned below.

This will now be explained typically with reference to the production of a shifter overlaid type of phase shift photomask.

FIG. 3 illustrates a first production method wherein an SOG coated on a substrate is selectively irradiated with electron radiation or laser light (e.g., Ar laser light of 363.8 nm wavelength), and then developed with a solvent to leave the portion irradiated with laser light while removing the unexposed portion, thereby patterning the SOG. First, provision is made of a blank 310 in which block layers 312 formed of chromium and arranged according to a given pattern are formed on a transparent substrate 311 (see FIG. 3(a)).

Following this, an SOG 340 was coated all over the surface of the substrate on which the block films 312 are formed, and then subjected to soft baking at 80° to 120° C. (see FIG. 3(b)).

Then, only given regions of the SOG are selectively irradiated with electron radiation 360 (see FIG. 3(c)).

Subsequently, the unexposed portion is removed by a development treatment while the portion irradiated with electron radiation or laser light 360 is kept intact, thereby obtaining a desired form of SOG shifter pattern 330A (see FIG. 3(d)).

After this, the SOG shifter pattern 330A is fired (see FIG. 3(e)), thereby obtaining a phase shift photomask 300 having the desired form of SOG shifter pattern 330A.

Firing is done by heating at 400° to 500° C. for the purpose of making an intimate SOG film having a high molecular weight.

A brief account will here be given of the SOG itself, and the principles of patterning the SOG.

By the "SOG" used herein is meant a film obtained by the conversion of an organic solvent solution of an organosilicon compound into silicon oxide by coating, drying, and heating. For the starting material for the SOG use may be made of metal alkoxides such as tetraethoxysilane, bipolar solvents such as water and methanol, hydrochloric acid, and the like. To allow methyl groups to remain in the SOG, triethoxymethylsilane, diethoxydimethylsilane, or trimethylethoxysilane is added to the tetraethoxysilane at an amount of a few % to a few tens %. By mixing these starting materials together, hydrolysis and polycondensation occur, resulting in the yielding of an Si—O polymer (polysilicate) having a low molecular weight.

Upon this low-molecular-weight SOG spin-coated on a substrate and subjected to soft baking, there is a slight increase in the molecular weight of the SOG.

Following this, the SOG is selectively irradiated with electron beams, ion beams, radiation light such as X-rays, γ-rays and SOR, or laser light (hereinafter referred to as ionizing radiation). This then causes the irradiated regions to be polymerized resulting in a molecular weight increase. After the irradiation of the SOG with ionizing radiation, the SOG is developed with an alcohol or other solvent, so that the portion irradiated with ionizing radiation is left intact while the unexposed portion is removed due to a molecular weight difference between both the portions, thereby patterning the SOG.

This method has an advantage in that the process involved is simple, but is impractical because the SOG itself has a low sensitivity to ionizing radiation.

Accordingly, the patterning of the SOG has generally been carried out by such a second method as shown in FIG. 4.

This method makes use of a photosensitive resist having a high sensitivity to ionizing radiation (electron radiation) for the purpose of patterning the SOG. The resist coated on the SOG is selectively irradiated with (or exposed to) electron radiation. Thereafter, the resist is developed with a suitable solvent to form a resist pattern through a difference in solubility in the solvent between the exposed and unexposed portions. Then, the SOG is etched in a form conforming to this pattern, thereby forming an SOG shifter pattern.

First, provision is made of a blank 410 in which block films 412 formed of chromium are provided according to a given pattern on a transparent substrate 411 (see FIG. 4(a)), after which an etching stopper layer 420 to be used for the etching of the SOG is formed (see FIG. 4(b)).

Then, an SOG 430 is coated all over the surface of the substrate on which the block films 412 are formed (see FIG. 4(c)). After removal of a peripheral SOG film from the substrate, the SOG 430 is fired (see FIG. 4(d)).

This firing step by heating at 400° to 500° C. yields an intimate SOG film having a high molecular weight.

Thereafter, a photosensitive resist 440 is coated on the SOG 430, and dried (see FIG. 4(e)), after which a conductive layer 450 is formed on the resist for surface conductivity (see FIG. 4(f)). Then, given regions of the conductive layer are selectively irradiated with electron radiation 460 (see FIG. 4(g)).

Subsequently, a resist pattern 440A is formed by a development treatment and drying (see FIG. 4(h)), and the SOG 430 is etched using this resist pattern 440A as an etching-resistant mask (see FIG. 4(i)).

Subsequent removal of the resist pattern 440A yields a phase shift photomask 400 having a desired SOG shifter pattern 430A formed thereon (see FIG. 4(j)).

Thus, the second method is a complicated process involving a number of steps, and so likely to induce many defects.

As described above, the problem with the first method is that it is impractical because the SOG itself has a low sensitivity to ionizing radiation, while the problem with the second method is that it is a complicated process likely to induce many defects. A solution to these problems is now sought out.

Apart from this, it has recently been proposed to increase the sensitivity of a resist by incorporating an acid generator therein. Thus, the aforesaid first method has been modified, too, such that an SOG shifter pattern is fabricated using an acid generator-containing SOG.

However, this method does also offer a problem in that such an acid generator-containing SOG has a low transmittance with respect to light lying in the ultraviolet region.

The leading reason is that the acid generator generally contains an ultraviolet-sensitive group, which absorbs ultraviolet radiation.

SUMMARY OF THE INVENTION

The situation being like this, an object of the present invention is to provide a method of producing a phase shift photomask capable of forming a shifter pattern comprising SOG having a high transmittance to ultraviolet radiation by forming an acid generator-containing SOG directly into plate to form an SOG shifter pattern.

The present invention provides a method of producing a phase shift photomask having a phase shift layer comprising SOG, characterized by at least comprising steps of coating an acid generator-containing SOG on a photomask substrate, selectively irradiating the thus coated SOG layer with ionizing radiation, and developing the SOG layer with a suitable solvent to form a shifter pattern comprising said SOG, and further including a step of irradiating the overall surface of the thus formed SOG shifter pattern with ultraviolet radiation and/or heating the thus formed SOG shifter pattern at a high temperature to decompose a photosensitive group absorbing ultraviolet radiation, thereby making the SOG layer transparent to ultraviolet radiation used to transfer said SOG layer onto a wafer.

The aforesaid production method is also characterized in that after the step of selectively irradiating the coated SOG layer with ionizing radiation, an additional step of baking the SOG layer and then developing the thus baked SOG layer with a suitable solvent to form the shifter pattern comprising said SOG is carried out.

The aforesaid production method is further characterized in that the acid generator-containing SOG has been premixed with a silane coupling agent.

The aforesaid production method is yet further characterized in that before coating the acid generator-containing SOG on the photomask substrate, a surface of said photomask substrate has been chemically modified by a silane coupling agent.

The aforesaid production method is yet further characterized in that the ultraviolet radiation used for said transfer onto a wafer has a wavelength of 240 nm or longer.

The aforesaid term "photomask substrate" is understood to mean an unfinished substrate such as a transparent substrate to form a phase shift photomask thereon, or a blank substrate having a given form of block film pattern or the like formed on a transparent substrate. The term "ionizing radiation" used herein is also understood to refer to electron beams, ions beams, radiation light such as X-rays, γ-rays or SOR, and laser light.

With the present production method of a phase shift photomask having a phase shift layer comprising SOG which involves such process steps as described above, it is possible to make use of a process involving direct selective irradiation of SOG with ionizing radiation and development of the SOG, i.e., a process involving the direct formation of SOG itself into plate to form an SOG shifter pattern, thereby making it possible to produce a phase shift photomask having a shifter pattern comprising SOG having a high transmittance to ultraviolet radiation used for transfer onto a wafer. It is consequently possible to simplify the fabrication of a phase shift photomask using SOG as a shifter layer and produce a phase shift photomask having little, if any, defect.

More specifically, by the incorporation of an acid generator in SOG it is possible to make the sensitivity of the SOG with respect to ionizing radiation practically higher than that of an acid generator-free SOG. By making use of the step of irradiating the overall surface of the formed SOG shifter pattern with ultraviolet radiation and/or heating the thus formed SOG shifter pattern at a high temperature to decompose a photosensitive group absorbing ultraviolet radiation, thereby making the SOG layer transparent to ultraviolet radiation used to transfer said SOG layer onto a wafer, it is possible to form a shifter pattern comprising SOG having a high transmittance with respect to ultraviolet radiation.

By premixing the aforesaid acid generator-containing SOG with a silane coupling agent, and chemically modifying the surface of a photomask substrate with a silane coupling agent prior to coating the acid generator-containing SOG on the photomask substrate, it is possible to improve the adhesion between the substrate and the SOG and, hence, make the phase shift photomask produced less likely to have defects.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 1 illustrates one production process of Example 1 of the phase shift photomask according to the present invention, FIG. 2 is a graphical view showing the light transmittance of SOG, and an SOG shifter pattern before and after exposure to ultraviolet radiation, FIG. 3 illustrates one production process of a phase shift photomask using conventional SOG as a shifter layer, FIG. 4 illustrates another production process of a phase shift photomask using conventional SOG as a shifter layer.

DESCRIPTION OF THE PREFERRED EMBODIMENTS

Figure 5:
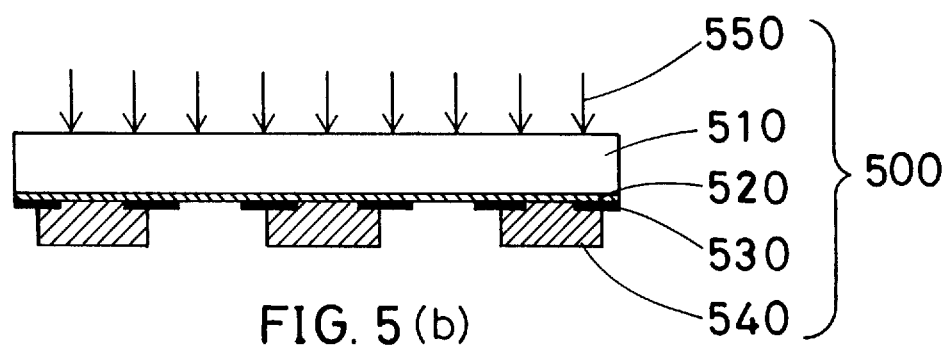
FIGS. 5(a)–5(c) illustrate how to transfer a phase shift photomask onto a wafer.
Figure 5:
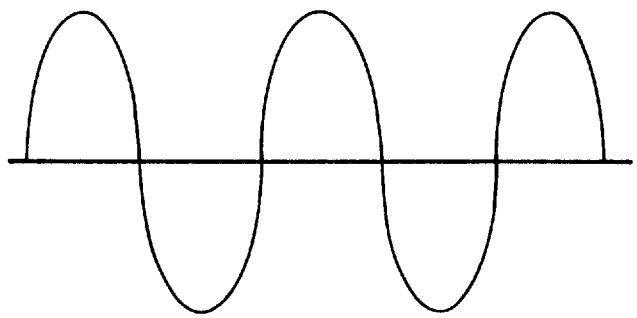
Figure 5:
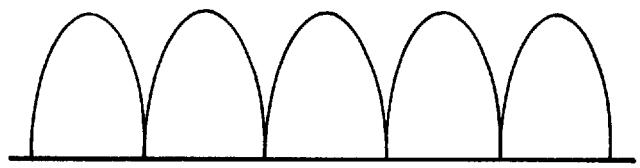
Figure 6A:
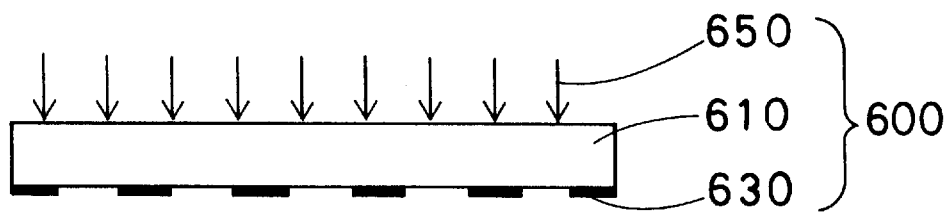
FIGS. 6(a)–6(c) illustrate how to transfer a conventional phase shift photomask onto a wafer.
Figure 6B:
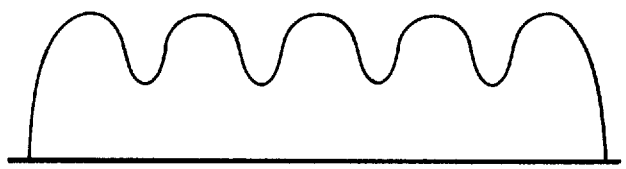
Figure 6C:
Figure 7A:
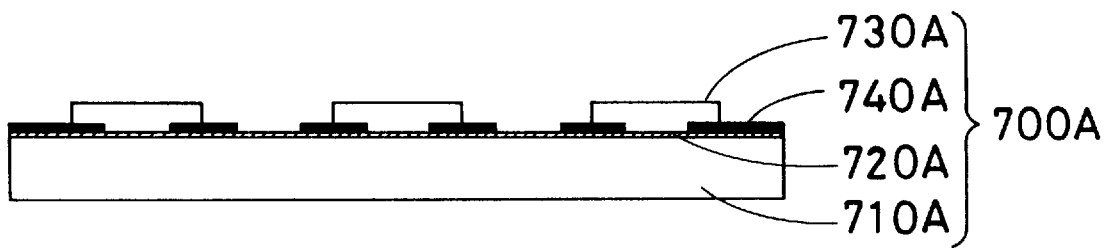
FIGS. 7(a)–7(d) illustrate a Levenson type of phase shift photomask.
Figure 7B:
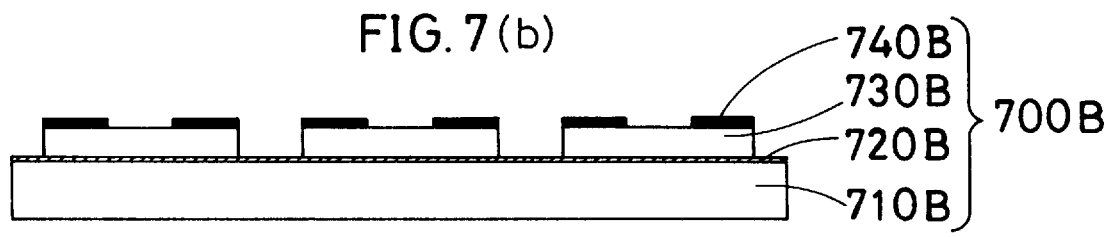
Figure 7C:
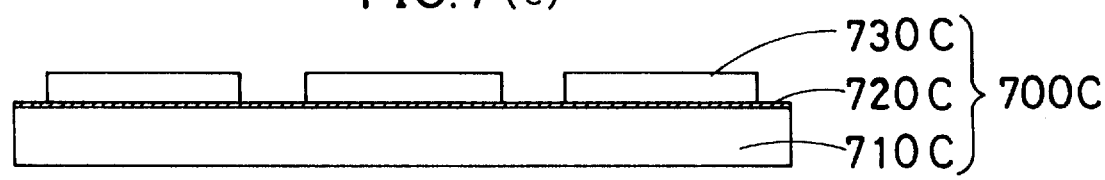
Figure 7D:
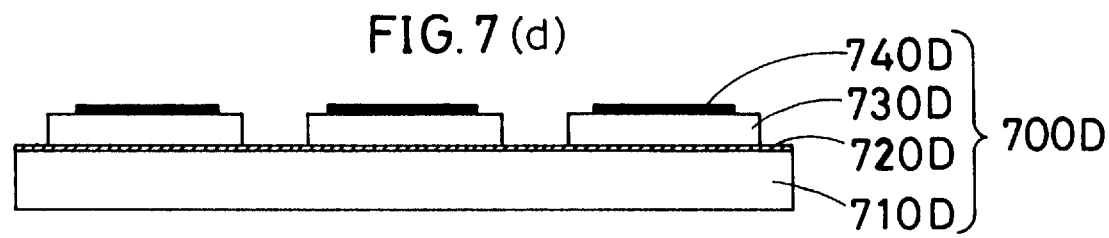

The method of producing a phase shift photomask having a phase shift layer comprising SOG according to the present invention will now be explained with reference to a specific embodiment.

FIG. 1 illustrates process steps of producing a phase shift photomask having a phase shift layer formed of SOG according to one embodiment of the present invention, with (a) to (g) showing sections of a substrate at the respective steps.

In FIG. 1, reference numeral 100 stands for a phase shift photomask, 110 a blank, 111 a transparent substrate, 112 a block layer pattern, 130 an SOG, 130A an SOG shifter pattern, 150 an antistatic film, 160 exposure light (electron radiation), and 170 ultraviolet radiation.

In this embodiment, a controlled mixture of 100 ml of SOG (made and sold by Tokyo Applied Chemistry Co., Ltd. under the trade name of T-7) with 0.5% by weight of an acid generator (triphenylsulfonium triphthalate made by Midori Chemicals Co., Ltd.) was used as an SOG photosensitive to electron radiation and coated on the substrate 110, thereby obtaining an SOG shifter pattern 130 A having a transmittance of at least 90% with respect to ultraviolet radiation, typically KrF (of 248 nm wavelength).

In what follows, this embodiment of the method of producing a phase shift photomask according to the present invention will be explained with reference to FIG. 1.

First, the blank 110 having the block layer pattern 112 was provided on the transparent substrate 111. To this end, a silane coupling agent or an aminosilane compound (with isopropyl alcohol used as a solvent) was spin-coated on the surface of the substrate, and baked at a temperature of 70° C. for 15 minutes over a hot plate for the chemical modification of that surface (see FIG. 1(a)). It is here to be noted that the silane coupling agent used is not always limited to the aminosilane compound.

Then, the aforesaid acid generator-containing photosensitive SOG 130 was spin-coated on the blank 110 to form an SOG film of 424 nm in thickness thereon by drying, on which the antistatic film 150 (aquaSAVE made by Nitto Chemical Co., Ltd.) was in turn coated at a film thickness of 70 nm (see FIG. 1(b)).

It is here to be understood that film thickness is determined by $$d=\lambda/(2n-1)$$

where $\lambda$ is an exposure wavelength at which the SOG is transferred onto a wafer, and n and d are a refractive index and thickness of the finally obtained SOG shifter pattern.

Following this, given regions of the SOG film were selectively irradiated with (or exposed to) electron radiation (beams) 160 at an exposure of 4 $\mu C/cm^2$ using an electron beam lithography system (HL700MIII made by Hitachi Denshi Ltd., and operating at an accelerated voltage of 20 KV) (see FIG. 1(c)).

After irradiation with (or exposure to) the electron radiation 160, PEB (post-exposure baking) was conducted at 90° C. for 5 minutes (see FIG. 1(d)).

PEB causes the exposed portion to undergo a dehydration and condensation reaction of silanol, resulting in curing.

After PEB, the SOG film was dipped in a 0.54N TMAH (tetramethylammonium hydroxide) solution for development, whereby the unexposed portion was removed to form the SOG shifter pattern 130A (see FIG. 1(e)).

After the SOG shifter pattern 130A had been formed, it was irradiated all over the surface with ultraviolet 170 from a low-pressure mercury lamp (see FIG. 1(f)).

This irradiation with ultultraviolet 170 was to decompose ultraviolet-absorbing sensitive groups. At this stage, the transmittance to KrF (of 248 nm wavelength) was found to be 90% or more.

Then, firing was conducted at 450° C. to form a shifter overlaid type of phase shift photomask 100 (see FIG. 1(g)).

This firing is to make the SOG hard, thereby enhancing the resistance of the SOG and improving the adhesion between the SOG and the substrate.

In this embodiment, exposure of the SOG plate was carried out by irradiating their given regions selectively with electron radiation using an electron beam lithography system. However, this may also be done with laser light (for instance, Ar laser of 363.8 nm wavelength) emitted from a laser lithography system. In this case, an acid generator showing absorption in the vicinity of 360 nm is used.

In the instant embodiment, PEB was conducted after irradiation with electron radiation. However, PEB may be dispensed with if patterning can be carried out by development immediately upon the completion of irradiation with electron radiation.

FIG. 2 shows transmittance curves in the instant embodiment of the SOG 130, and the SOG shifter pattern 130A before and after exposure. From this it is found that while the transmittance of the SOG 130 itself is low in the ultraviolet region, the SOG shifter pattern 130A of the phase shift photomask 100 according to the instant embodiment achieves a light transmittance of 90% at wavelengths of 240 nm or longer, shows a transmittance of 92% with respect to KrF (of 248 nm wavelength) used to transfer the shifter pattern 130A onto a wafer, and exhibits a transmittance of 92.5% with respect to i-line (of 365 nm wavelength).

Thus, the SOG shifter pattern 130A of the phase shift photomask 100 produced according to the instant embodiment can be said to have a practically high level of light transmittance at which it can effectively be used as a phase shifter layer for transfer onto a wafer using ultraviolet having a wavelength of 240 nm or higher.

Thus, with the instant embodiment where the SOG is formed directly into plate, it is possible to produce a phase shift photomask having a shift layer composed of SOG which can provide an effective phase shift photomask, even when the wavelength for transfer onto a wafer is that of KrF (of 248 nm wavelength).

The phase shift photomask 100 obtained in the instant embodiment and a phase shift photomask 300 obtained by the method shown in FIG. 3 were inspected using a visual inspection system (KLA 219HRL-PS). As a result, it was found that the phase shift photomask 100 is smaller in the number of defects than the phase shift photomask 300. This is because the instant embodiment is simpler in process than the conventional method shown in FIG. 3.

In the phase shift photomask obtained in the instant embodiment, the pattern was kept in place even upon subjected to a washing step, e.g., a physical washing step represented by a brush washing step; in other words, it was found that the adhesion between the shifter and the substrate is more improved as compared with a conventionally obtained mask.

In the method of producing a phase shift photomask having a phase shift layer composed of SOG (spin-on glass) according to the present invention, the SOG itself is formed into plate to form a shifter pattern when a phase shift photomask including a shifter pattern composed of SOG, as already described. It is thus possible to simplify the process of phase shift photomask production and, hence, to provide a method of producing a phase shift photomask having little, if any, defect.

To make the SOG (spin-on glass) layer transparent to ultraviolet, only relatively simple means involving overall exposure to ultraviolet and/or heating at high temperature is needed, so that phase shift photomask production can be much more simplified than ever before.

With the method of producing phase shift photomasks according to the present invention, improvements in terms of both productivity and quality can be achieved because the adhesion between the SOG shifter pattern and the substrate can be improved.

In particular, it is possible to produce a phase shift photomask which has a practical transmittance with respect to ultraviolet radiation used for transfer from the phase shift photomask to wafers, and is resistant to KrF excimer laser (of 248 nm wavelength).

The entirety of JP-7-222757 filed on Aug. 9, 1995, from which priority under 35 USC 119 is claimed, is incorporated herein by reference.

What we claim is:

1. A method of producing a phase shift photomask having a phase shift layer comprising SOG, comprising the steps of:

coating an acid generator-containing SOG on a photomask substrate, at least one of:

selectively irradiating the thus coated SOG layer with ionizing radiation, and developing the SOG layer with a suitable solvent to form a shifter pattern comprising said SOG, and at least one of:

irradiating the overall surface of the thus formed SOG shifter pattern with ultraviolet radiation, and heating the thus formed SOG shifter pattern at a high temperature to decompose a photosensitive group absorbing ultraviolet radiation, thereby making the SOG layer transparent to ultraviolet radiation used to transfer said SOG layer onto a wafer.

2. The method of producing a phase shift photomask having a phase shift layer comprising SOG according to claim 1, wherein after the step of selectively irradiating the coated SOG layer with ionizing radiation, an additional step of baking the SOG layer and then developing the thus baked SOG layer with a suitable solvent to form the shifter pattern comprising said SOG is carried out.

3. The method of producing a phase shift photomask having a phase shift layer comprising SOG according to claim 1, wherein the acid generator-containing SOG has been premixed with a silane coupling agent.

4. The method of producing a phase shift photomask having a phase shift layer comprising SOG according to claim 1, 2, or 3, wherein before coating the acid generator-containing SOG on the photomask substrate, a surface of said photomask substrate has been chemically modified by a silane coupling agent.

5. The method of producing a phase shift photomask having a phase shift layer comprising SOG according to claim 1, 2 or 3, wherein the ultraviolet radiation used for said transfer onto a wafer has a wavelength of 240 nm or longer.

6. A method according to claim 1, wherein the coating step comprises the step of coating at least a portion of the acid generator-containing SOG directly on the photomask substrate.

7. A method according to claim 1, wherein all of the coating, selectively irradiating, developing, irradiating and heating steps are performed.

8. The method of producing a phase shift photomask having a phase shift layer comprising SOG according to claim 4, characterized in that the ultraviolet radiation used for said transfer onto a wafer has a wavelength of 240 nm or longer.

* * * * *